US012538733B2

(12) United States Patent
Okubo et al.

(10) Patent No.: US 12,538,733 B2
(45) Date of Patent: Jan. 27, 2026

(54) STEALTH DICING LASER DEVICE

(71) Applicant: SAMSUNG ELECTRONICS CO., LTD., Suwon-si (KR)

(72) Inventors: Akinori Okubo, Hwaseong-si (KR); Youngchul Kwon, Asan-si (KR); Sungho Jang, Yongin-si (KR); Jungchul Lee, Hwaseong-si (KR); Deoksuk Jang, Pyeongtaek-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 587 days.

(21) Appl. No.: 18/073,980

(22) Filed: Dec. 2, 2022

(65) Prior Publication Data

US 2023/0187235 A1 Jun. 15, 2023

(30) Foreign Application Priority Data

Dec. 8, 2021 (KR) .................. 10-2021-0174450

(51) Int. Cl.
*H01L 21/67* (2006.01)
*B23K 26/53* (2014.01)
*G02B 27/00* (2006.01)
*G02B 27/09* (2006.01)
*B23K 26/0622* (2014.01)
*B23K 103/00* (2006.01)
(Continued)

(52) U.S. Cl.
CPC ........ *H01L 21/67092* (2013.01); *B23K 26/53* (2015.10); *G02B 27/0081* (2013.01); *G02B 27/0927* (2013.01); *B23K 26/0622* (2015.10); *B23K 2103/56* (2018.08); *G02B 19/0047* (2013.01); *G02B 27/126* (2013.01)

(58) Field of Classification Search
CPC .............. H01L 21/67092; B23K 26/53; B23K 26/0622; B23K 2103/56; B23K 2101/40; B23K 26/0648; B23K 26/38; G02B 27/0081; G02B 27/0927; G02B 19/0047; G02B 27/126
See application file for complete search history.

(56) References Cited

U.S. PATENT DOCUMENTS

| 9,212,081 B2 | 12/2015 | Peng et al. |
| 10,777,459 B2 | 9/2020 | Ono et al. |
| 10,950,468 B2 | 3/2021 | Minaminaka et al. |

(Continued)

FOREIGN PATENT DOCUMENTS

| KR | 10-2015-0047615 A | 5/2015 |
| KR | 10-2020-0001968 A | 1/2020 |

(Continued)

*Primary Examiner* — Mariam Qureshi
(74) *Attorney, Agent, or Firm* — Muir Patent Law, PLLC

(57) ABSTRACT

A stealth dicing laser device including: a pulse laser generator configured to generate laser light; a condenser lens formed in an optical path of the laser light; a pupil filter configured to transform a phase of the laser light before the laser light passes through the condenser lens; and a controller configured to provide a phase control signal to the pupil filter, wherein the pupil filter transforms the phase of the laser light based on the phase control signal, wherein the phase control signal is a signal transforming a phase expression of the laser light based on a parameter.

20 Claims, 19 Drawing Sheets
(12 of 19 Drawing Sheet(s) Filed in Color)

(51) Int. Cl.
    *G02B 19/00*         (2006.01)
    *G02B 27/12*         (2006.01)

(56)            References Cited

U.S. PATENT DOCUMENTS

| | | | |
|---|---|---|---|
| 2005/0206850 A1* | 9/2005 | Shimizu | G03F 7/70525 |
| | | | 353/55 |
| 2006/0227306 A1* | 10/2006 | Hirukawa | G03F 7/70625 |
| | | | 355/53 |
| 2015/0164689 A1 | 6/2015 | Vogel et al. | |
| 2017/0018415 A1* | 1/2017 | Zhao | G02B 21/0076 |
| 2020/0006909 A1 | 1/2020 | Kwon et al. | |
| 2020/0298346 A1 | 9/2020 | Kwon et al. | |
| 2021/0146476 A1 | 5/2021 | Kwon et al. | |
| 2021/0159121 A1 | 5/2021 | Yoon et al. | |

FOREIGN PATENT DOCUMENTS

| | | |
|---|---|---|
| KR | 10-2020-0111421 A | 9/2020 |
| KR | 10-2021-0059818 A | 5/2021 |

* cited by examiner

Zernike phase filter map

$$W(r, \theta) = \sum_{k=1}^{n} C_k Z_k (r, \theta)$$

STEALTH DICING LASER DEVICE

CROSS-REFERENCE TO THE RELATED APPLICATION

This application claims priority from Korean Patent Application No. 10-2021-0174450, filed on Dec. 8, 2021, in the Korean Intellectual Property Office, the disclosure of which is incorporated herein by reference in its entirety.

BACKGROUND

1. Field

Embodiments relate to a stealth dicing laser device.

2. Description of the Related Art

In order to divide a substrate formed with a semiconductor device, an electronic element, etc., into individual chips, a cutting device may be used. The cutting device may be configured to cut the substrate using a thin cutting blade, which is formed with fine diamonds as an abrasive grain, which is inserted into a grinding groove of the substrate. In a substrate cutting procedure using such a cutting blade, chipping may occur at a front-side or a back-side of the substrate. Such chipping may result in performance degradation of the divided chip.

SUMMARY

Embodiments are directed to a stealth dicing laser device, including a pulse laser generator configured to generate laser light; a condenser lens formed in an optical path of the laser light; a pupil filter configured to transform a phase of the laser light before the laser light passes through the condenser lens; and a controller configured to provide a phase control signal to the pupil filter, wherein the pupil filter transforms the phase of the laser light based on the phase control signal, wherein the phase control signal is a signal transforming a phase expression of the laser light based on a parameter.

Embodiments are directed to a stealth dicing laser device, including a pulse laser generator configured to generate laser light; an expander configured to allow the laser light to pass therethrough, the expander including at least one lens; at least one mirror configured to reflect the laser light; a prism mirror configured to reflect the laser light or to allow the laser light to pass therethrough; relay optics configured to allow the laser light to pass therethrough, the relay optics including at least one lens; a condenser lens formed in an optical path of the laser light; a plurality of pupil filters configured to transform a phase of the laser light before the laser light passes through the condenser lens; a controller configured to provide a phase control signal to at least one of the plurality of pupil filters; and an optimizer configured to optimize the phase control signal through a parameter, wherein the pupil filter provided with the phase control signal transforms the phase of the laser light based on the phase control signal, wherein the phase control signal is a signal transforming a phase expression of the laser light based on the parameter.

Embodiments are directed to a laser device for generating laser light between 1.0 μm and 1.34 μm, for formation of a stealth dicing layer at a silicon layer, the laser device including a pulse laser generator configured to generate laser light; a condenser lens formed in an optical path of the laser light; a pupil filter configured to transform a phase of the laser light; and a controller configured to provide a phase control signal to the pupil filter, wherein the pupil filter transforms the phase of the laser light based on the phase control signal, wherein the phase control signal is a signal transforming a phase expression of the laser light based on a parameter, wherein the parameter is a continuous function, and a domain of the continuous function is constituted by a polynomial, wherein the polynomial is a Zernike polynomial; and wherein an order of the Zernike polynomial is selected from at least one of second, fourth, fifth, seventh, ninth, tenth, twelfth and fourteenth orders.

BRIEF DESCRIPTION OF THE DRAWINGS

The patent or application file contains at least one drawing executed in color. Copies of this patent or patent application publication with color drawings will be provided by the Office upon request and payment of the necessary fee.

Features will become apparent to those of skill in the art by describing in detail example embodiments with reference to the attached drawings in which.

DETAILED DESCRIPTION

Figure 1:
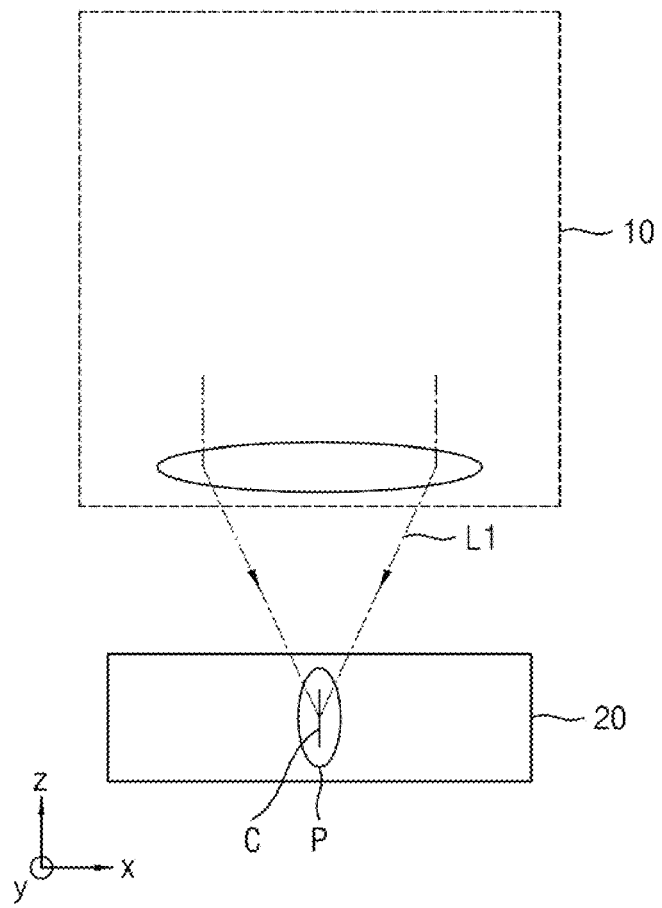
FIG. 1 is a lateral sectional view of a substrate explaining that laser light emitted from a laser device is condensed in the vicinity of a concentration point inside a substrate, thereby forming a modified region and a crack.
Figure 2:
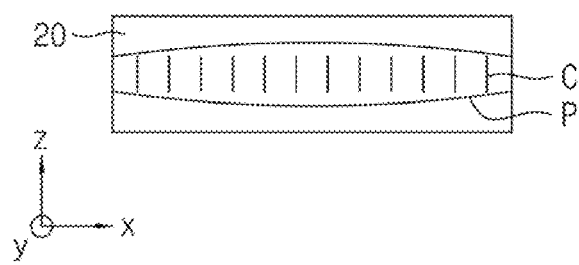
FIG. 2 is a lateral sectional view of a substrate explaining that laser light emitted from a laser device forms a plurality of modified regions and a plurality of cracks.

FIG. 1 is a lateral sectional view of a substrate explaining that laser light emitted from a laser device is condensed in the vicinity of a concentration point inside a substrate, thereby forming a modified region and a crack. FIG. 2 is a lateral sectional view of a substrate explaining that laser light emitted from a laser device forms a plurality of modified regions and a plurality of cracks.

Referring to FIG. 1, laser light L1 from a laser device 10 passing through a surface of a substrate 20 including silicon (Si) (or a silicon wafer or a semiconductor substrate) (hereinafter, referred to as a "substrate") concentrates energy in the vicinity of a concentration point. The laser light L1 condensed in the vicinity of the concentration point inside the substrate 20 may form a modified region P and a crack C.

The laser device 10 may be a stealth dicing (SD) laser device. The stealth dicing laser device 10 may focus laser light L1 for cutting, which has a wavelength capable of passing through the substrate 20, on one spot inside the substrate 20 by concentrating the laser light L1 by a lens. The focusing laser light L1 for cutting may be constituted by a short pulse oscillating at a high repetition rate, and the laser light L1 for cutting may be highly condensed to a critical level of diffraction. The laser light L1 for cutting may be concentrated at a very high peak power density in the vicinity of the concentration point inside the substrate and, at the same time, may be spatially compressed. When the density of the laser light L1 for cutting exceeds a peak power density in a condensing procedure, a very high non-linear multiphoton absorption phenomenon may occur in the vicinity of the concentration point. Due to the very high non-linear multiphoton absorption phenomenon occurring in the vicinity of the concentration point, crystals of the substrate 20 may absorb energy of the light concentrated inside the substrate 20, thereby generating a thermal melting phenomenon, and, as such, a modified region P and a crack C may be formed. When the laser device 10 is used, it may be possible to selectively process only a local point inside the substrate without damage to a front-side and a back-side inside the substrate. In addition, the laser device 10 may include a mechanism for moving a relative position between the laser light L1 and the substrate (for example, movement in a scanning direction) in order to cut the substrate at high speed in accordance with a cutting pattern.

Referring to FIG. 2, the laser device 10 may relatively move in the scanning direction (a processing direction) (for example, an x-axis direction) after forming a modified region P and a crack C at a portion inside the substrate 20, thereby forming a plurality of modified regions P, P, . . . and a plurality of cracks C, C, . . . . As the plurality of modified regions P and the plurality of cracks C are formed, the substrate 20 may lose balance of intermolecular forces and, as such, the substrate 20 may be naturally divided, starting from the modified regions P and the cracks C, when external force is applied to the substrate 20.

Figure 3:
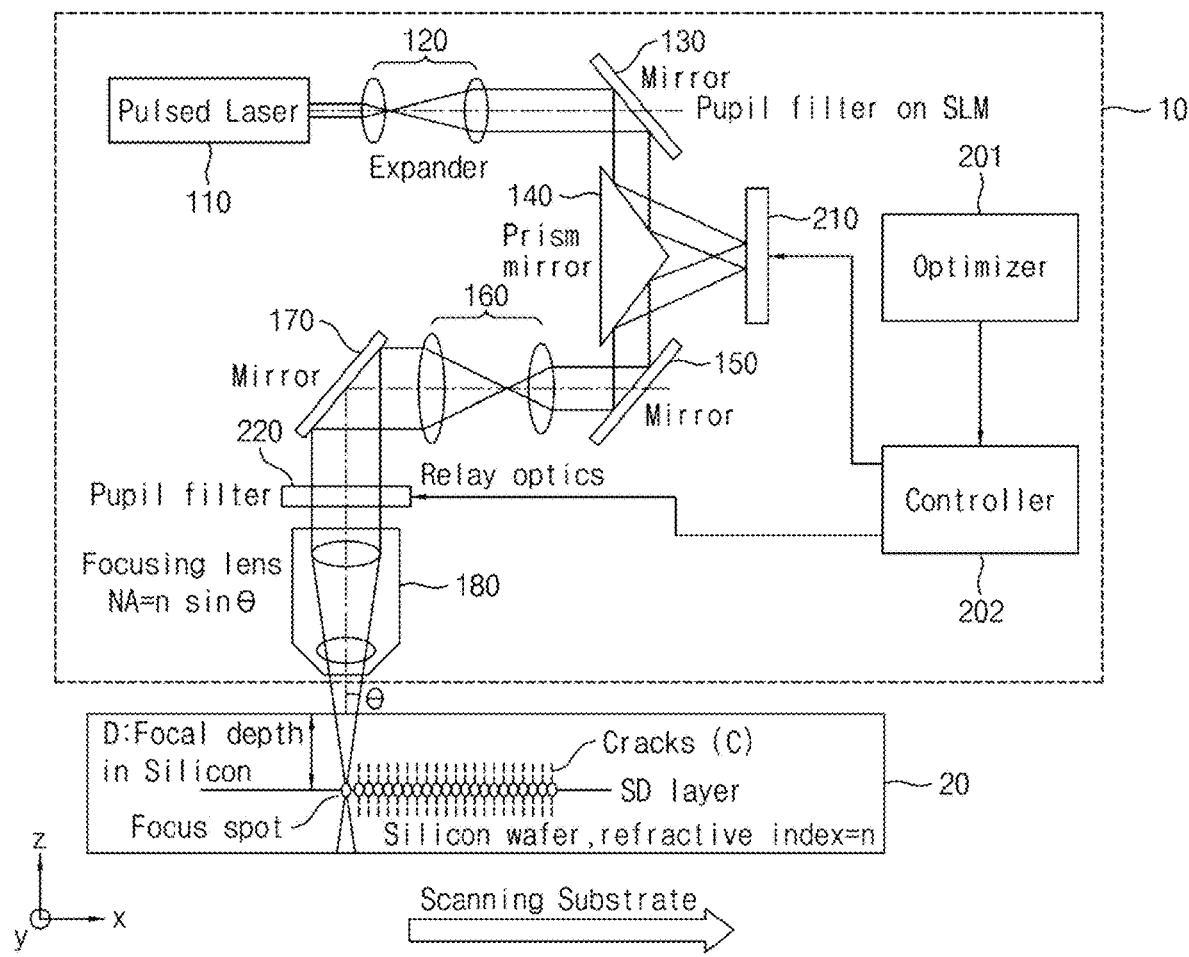
FIG. 3 shows a schematic optical configuration of a laser device according to an example embodiment.
Figure 4:
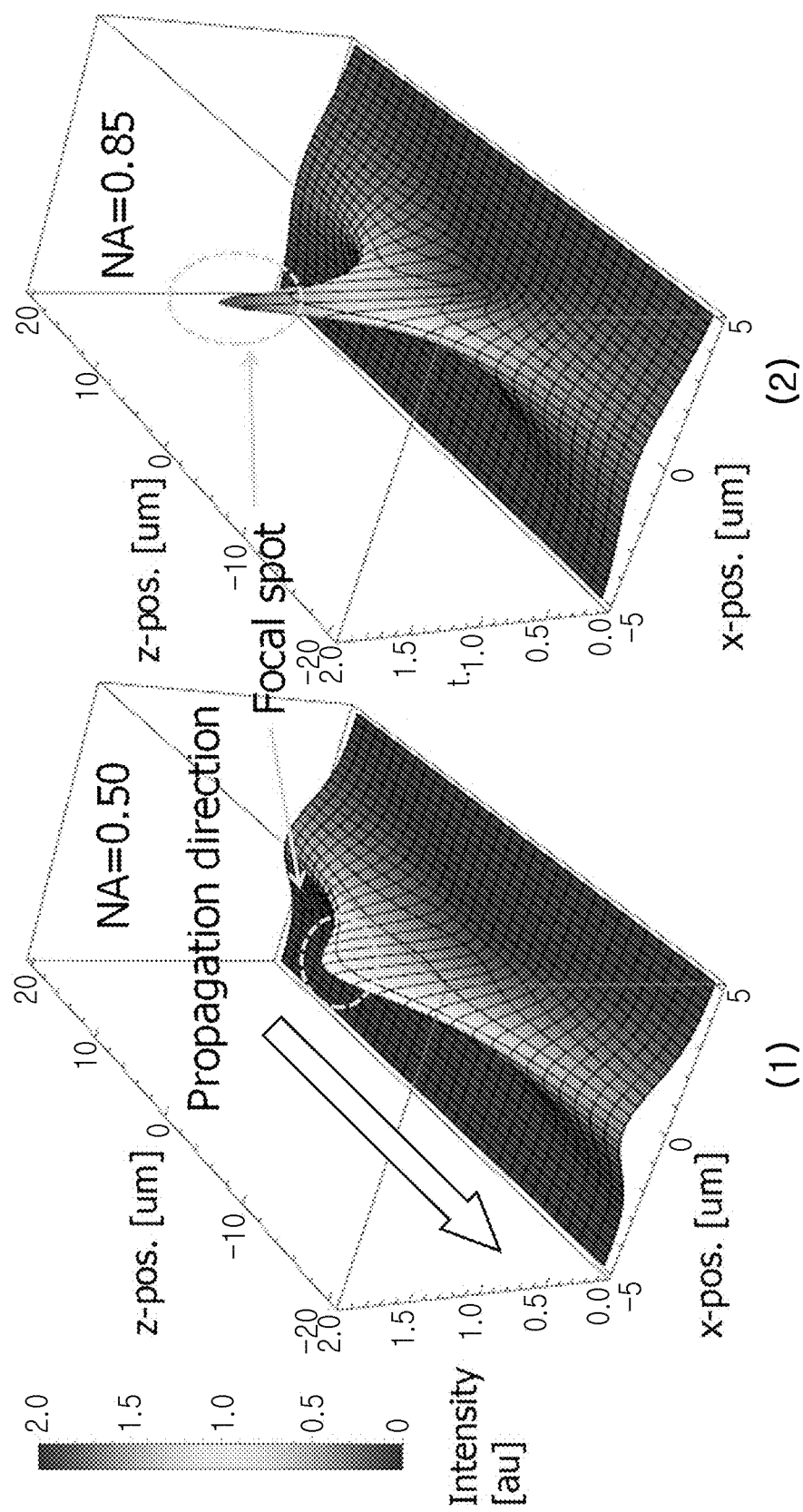
FIG. 4 shows a focal spot intensity profile of laser light inside a substrate when NA is, for example, 0.5 or 0.85.

FIG. 3 shows a schematic optical configuration of a laser device according to an example embodiment. FIG. 4 shows a focal spot intensity profile of laser light inside a substrate when NA is, for example, 0.5 or 0.85.

Referring to FIGS. 3 and 4, in an example embodiment, a laser device 10 may include a laser generator 110, an expander 120, a plurality of mirrors 130, 150, and 170, a prism mirror 140, relay optics 160, at least one pupil filter 210 and 220, and a concentration unit 180. In an example embodiment, laser light may be generated from the laser generator 110, and may then irradiate a substrate 20 via the expander 120, the plurality of mirrors 130, 150, and 170, the prism mirror 140, the relay optics 160, at least one pupil filter 210 and 220, and the concentration unit 180. For example, laser light may be generated from the laser generator 110, and may then irradiate the substrate 20 after sequentially passing through the expander 120, the first mirror 130, the prism mirror 140, the first pupil filter 210, the second mirror 150, the relay optics 160, the third mirror 170, the second pupil filter 220, and the concentration unit 180.

In an example embodiment, the laser generator 110 may generate pulsed laser light having an amplitude varying in accordance with a phase. In an example embodiment, the laser light generated from the laser generator 110 may pass through the expander 120. For example, the expander 120 may be an expander including at least one lens. In an example embodiment, the laser light passing through the expander 120 may be reflected by the first mirror 130. In an example embodiment, the laser light reflected by the first mirror 130 may pass through the prism mirror 140 or may be reflected by the prism mirror 140. In an example embodiment, the laser light passing through the prism mirror 140 or reflected by the prism mirror 140 may again pass through the prism mirror 140 via the pupil filter 210 or may be again reflected by the prism mirror 140 via the pupil filter 210. In an example embodiment, the laser light again passing through the prism mirror 140 or again reflected from the prism mirror 140 via the first pupil filter 210 may be reflected by the second mirror 150. In an example embodiment, the laser light reflected by the second mirror 150 may pass through the relay optics 160. For example, the relay optics 160 may include at least one lens. In an example embodiment, the laser light passing through the relay optics 160 may be reflected by the third mirror 170. In an example embodiment, the laser light reflected by the third mirror 170 may pass through the second pupil filter 220. In an example embodiment, the laser light passing through the second pupil filter 220 may be concentrated inside the substrate 20 through the concentration unit 180. For example, the second pupil filter 220 may be disposed on an optical path between the relay optics 160 and the concentration unit 180. For example, the concentration unit 180 may include at least one focusing lens (condenser lens).

The wavelength of the laser light emitted from the laser device 10 may be selected to be semitransparent with respect to the substrate 20. In an example embodiment, the wavelength of the laser light may range between 1.0 μm and 1.34 μm. The laser light may be concentrated inside the substrate 20 through the concentration unit 180. Silicon (Si) constituting the substrate 20 may not be perfectly transparent in a near infrared (NIR) range and, as such, focused laser light may be absorbed in the vicinity of a focal point.

When the peak intensity of a focal spot (for example, a focal point) exceeds a critical value of non-linear effects, a crack C may be formed in the vicinity of a focal spot inside the substrate 20. In addition, a region similar to a crack (for example, a modified region D shown in FIGS. 1 and 2) may be formed inside the substrate 20 over and under the crack C. A stealth dicing (SD) layer may be formed by an arrangement of cracks C by irradiation of laser light and scanning of the substrate 20.

For example, the shape of the crack C in an SD layer formation procedure may be associated with a spot intensity distribution in the vicinity of a focal spot. The focal spot size and the depth-of-focus (DOF) in the SD layer inside the substrate 20 may be expressed by the following Expression 1 and Expression 2.

$$\text{Focal spot size} = k_1 \frac{\lambda}{NA} \quad \text{[Expression 1]}$$

$$DOF = k_2 \frac{\lambda}{2n\left(1 - \sqrt{1 - (NA/n)^2}\right)} \quad \text{[Expression 2]}$$

In Expression 1 and Expression 2, λ is a wavelength of a laser source, NA is a numerical aperture (or an aperture width) of the condenser lens, n is a refractive index of the substrate 20, and $k_1$ and $k_2$ are constant coefficients determined in accordance with process conditions. For example, the refractive index of silicon with respect to a wavelength of 1.1 µm is around 3.5 (n=around 3.5), and a spot intensity distribution in this case may be further lengthened in a concentration direction, as compared to a spot size in air. In order to create a high peak intensity distribution, a careful focal spot control may be needed.

In FIG. 4, when NA increases, as in graph 2, focal spot size decreases, and peak intensity increases, as compared to graph 1. When DOF decreases, as in the graph 2, density of laser power increases in the substrate 20, as compared to the graph 1.

In an example embodiment, the laser device 10 may further include an optimizer 201 and a controller 202.

The optimizer 201 may set a parameter functioning as the foundation of transformation of the phase of laser light. The controller 202 may be connected to the first pupil filter 210 and/or the second pupil filter 220 and, as such, may provide a phase control signal functioning as the foundation of transformation of the phase of laser light passing through the first pupil filter 210 and/or the second pupil filter 220. The phase control signal may be based on the parameter set in the optimizer 201. The phase of the laser light passing through the pupil filters 210 and 220 may be transformed through parameterization thereof.

In some example embodiments, the controller 202 may provide the phase control signal to the first pupil filter 210. In some example embodiments, the controller 202 may provide the phase control signal to the second pupil filter 220. In some example embodiments, the controller 202 may provide the phase control signal to both the first pupil filter 210 and the second pupil filter 220.

In another example embodiment, the optimizer 201 and the controller 202 may be disposed at the outside of the laser device 10. In addition, in another example embodiment, the optimizer 201 and the controller 202 may be one constituent element including all of respective functions thereof.

Figure 5:
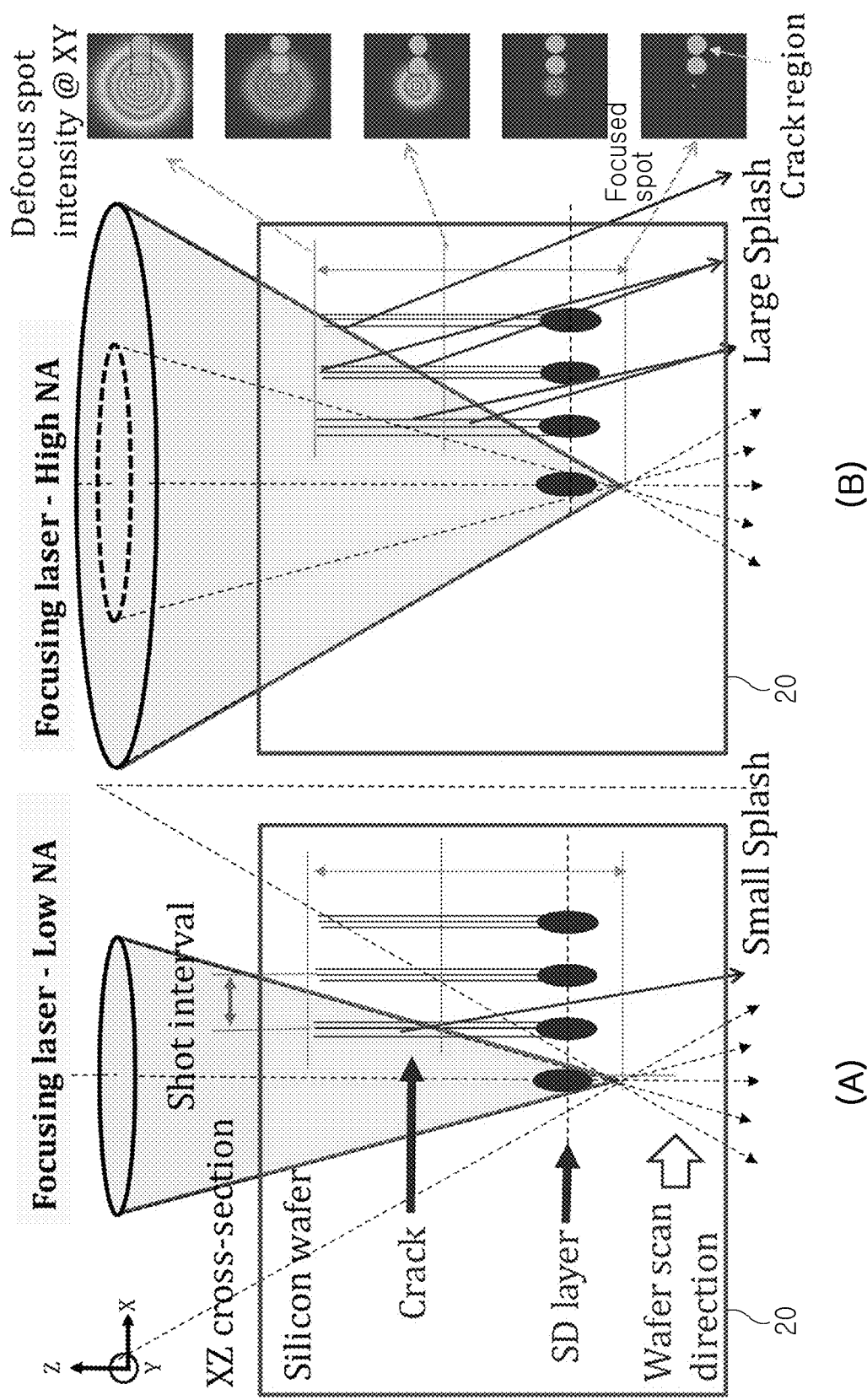
FIG. 5 shows an example of a laser beam splash effect in laser stealth dicing.
Figure 6:
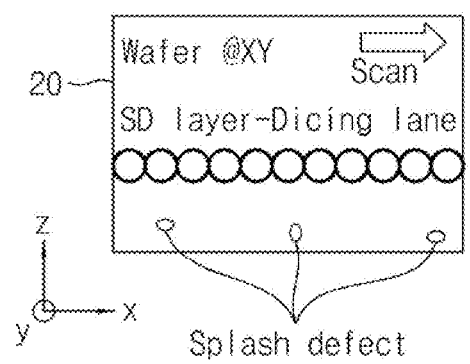
FIG. 6 shows an example of a splash defect observed at a portion adjacent to a bottom of a substrate.

FIG. 5 shows an example of a laser beam splash effect in laser stealth dicing. FIG. 6 shows an example of a splash defect observed at a portion adjacent to a bottom of a substrate.

Referring to FIGS. 5 and 6, a part of laser light may interact with an already-present crack, and another part of the laser light may be reflected from a boundary of the crack. That is, a part of the laser light may be splashed out from the crack. Here, the splashed-out laser light corresponds to splash. As a result, such splash may degrade the cutting quality of the substrate 20 and may cause a splash defect.

For example, laser light corresponding to low NA may generate decreased splash defects, whereas laser light corresponding to high NA may generate increased splash defects. In order to enhance the dicing quality of the substrate 20 through suppression of splash, it may be important to control laser light power interacting with cracks. When laser light has an asymmetric shape, the laser light may degrade a focused spot profile, and may also cause a reduction in next peak power and a degradation in dicing quality. Therefore, it may be important to additionally improve technology for controlling the shape of a focused spot in an asymmetrical manner in order to minimize splash defects.

Figure 7:
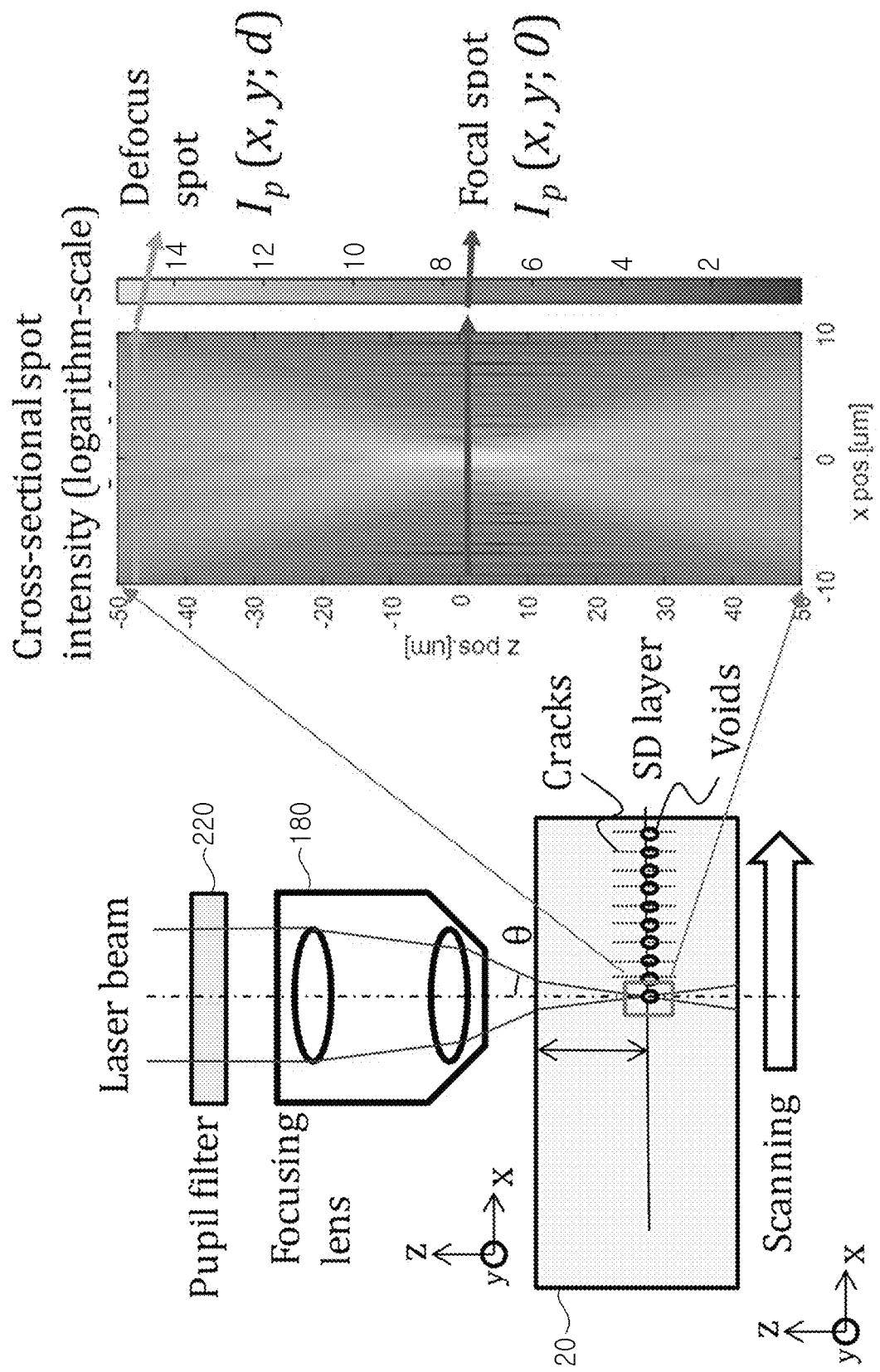
FIG. 7 is a view showing a concept diagram of an evaluation data set including a defocused spot and a focused spot.
Figure 8:
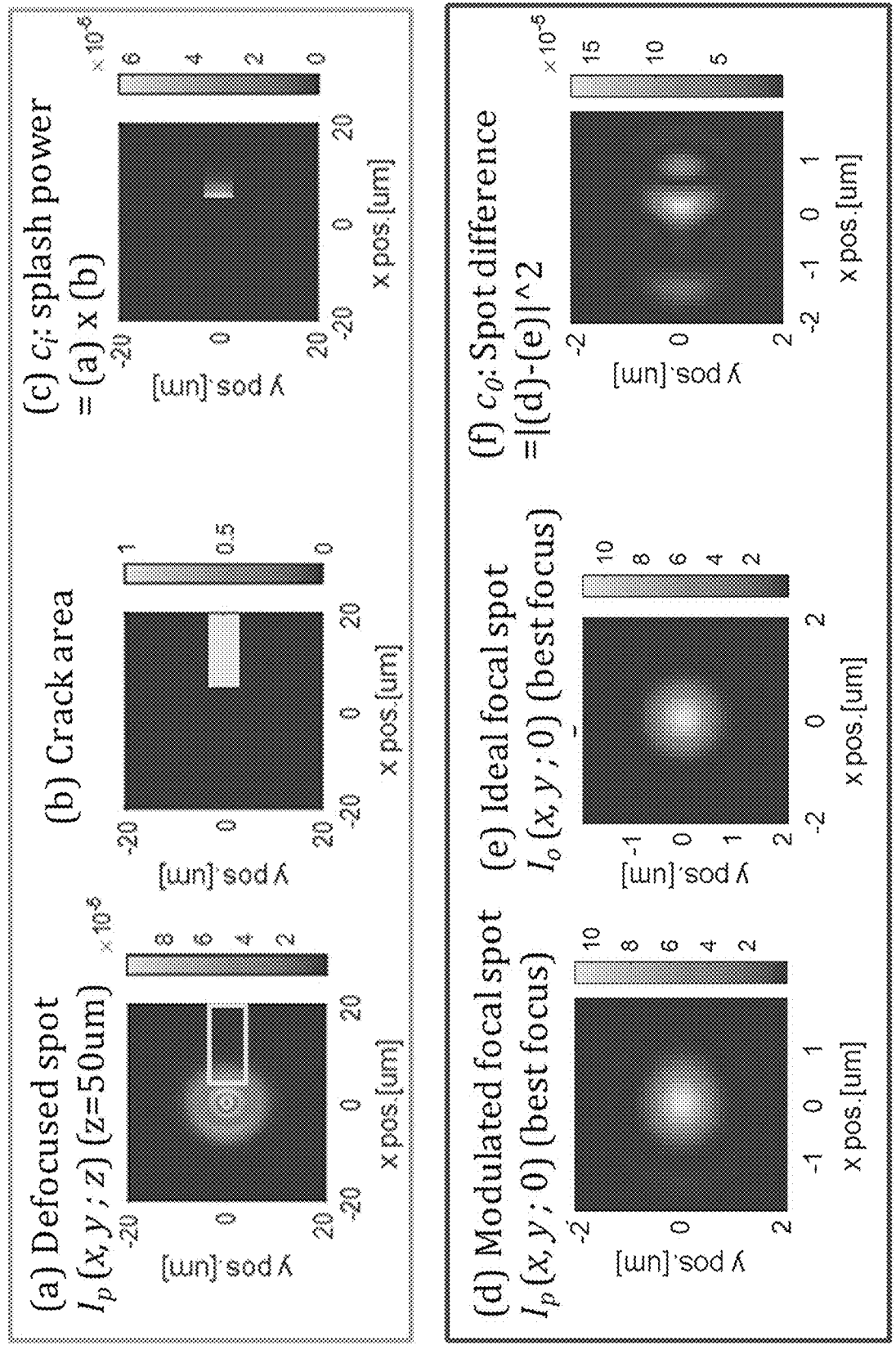
FIG. 8 is a view explaining a cost function.

FIG. 7 is a view showing a concept diagram of an evaluation data set including a defocused spot and a focused spot. FIG. 8 is a view explaining a cost function.

Referring to FIGS. 7 and 8, in an experimental example, splash effects were evaluated through an optical simulation of a light profile, a defocused spot profile and a focused spot profile through a focal spot. The optical simulation is based on scalar diffraction theory (for example, Fraunhofer diffraction) for multiple defocused planes. In this optical simulation, the wavelength of laser light may be 1.1 µm, the NA of an objective lens may be 0.67, and the input beam intensity profile of a pupil plane may be based on a Gaussian distribution. The sigma value of the Gaussian distribution is 0.4 (NA). In this evaluation, two essential parameters, that is, splash power and focused intensity profile, are defined. The splash power is defined by a sum of focused laser power inside cracks. A defocused amount for estimation of splash is defined to be 40 µm in this optical configuration. A crack may be defined based on a shot interval and the diameter of the crack for one pulse laser shot. Crack size is assumed to be x>5 µm and −3 µm<y<3 µm, and this is based on the current crack size according to experimental results (laser light interval pitch=8 µm, and crack diameter=6 µm). Another evaluation parameter is focused peak intensity for a dicing quality index. For more accuracy, it is important to check interaction (requirements) between a focused spot and the substrate 20.

The following attributes (requirements) are important in a focused spot distribution in laser stealth dicing:

(i) a spot (small spot size) approximate to diffraction—to maintain a dicing quality;

(ii) an asymmetrical defocused spot profile suppressing splash—to reduce a laser output overlapping with a crack; and (iii) small laser power loss—to maintain the yield of a dicing process.

There is tradeoff among the above—described three requirements. Accordingly, for optimization of the focused beam shape under such tradeoff, formation of an asymmetric beam through focusing is needed. Pupil filters of various types for formation of a focused beam have been proposed for aberration correction, generation of multiple spots or extension of a focusing depth. However, such pupil filters may not satisfy the above-described requirements because a focused beam has an axially-symmetrical intensity distribution. Therefore, the following three concepts of an asymmetrical pupil filter method for formation of asymmetrically-focused laser light (for example, having an asymmetrical shape with reference to an axis (for example, a y-axis) perpendicularly intersecting a scanning direction on a plane) may be considered:

an asymmetrical amplitude filter (for example, Pacman type);

an asymmetrical segmented pupil filter (phase filter); and an asymmetrical Zernike parameter pupil filter (phase filter).

Next, details of the above-described pupil filters and verification results will be described.

For pupil filter design and evaluation, a quantitative cost function may be needed. First, a simulation model for an evaluation focusing on a focal spot will be described. A three-dimensional focused spot distribution $I_p(x, y; z)$ may be expressed by the following Expressions 3 to 5.

$$I_p(x,y;z)=|g_p(x,y;z)|^2 \quad \text{[Expression 3]}$$

$$g_p(x,y;z)=FT[f(u,v)p(u,v)e^{i2\pi W_d(u,v;z)}] \quad \text{[Expression 4]}$$

$$p(u,v)=a(u,v)e^{i2\pi W(u,v)} \quad \text{[Expression 5]}$$

In Expressions 3 to 5, $g_P$ is a complex amplitude of a three-dimensional focal spot, $f(u, v)$ is a beam distribution of a pupil plane, $p(u, v)$ is a pupil filter function (for example, an intra-pupil-filter segment function), and $W_d(u, v)$ is a defocusing period. The pupil filter function may be expressed by an amplitude distribution $a(u, v)$ and a phase distribution $W(u, v)$ in Expression 5. A cost function may be defined in order to evaluate performance for the above-described requirements (i) to (iii). Cost functions co and ci of the following Expressions 6 and 7 correspond to the requirements (i) and (ii), respectively.

$$c_0 = \int\int_{-L/2}^{+L/2} |I_p(x,y;0) - I_o(x,y;0)|^2 \, dxdy \quad \text{[Expression 6]}$$

$$c_i = \int\int_{crack} I_p(x,y;d_i) \, dxdy \quad \text{[Expression 7]}$$

In Expressions 6 and 7, $I_p(x, y; z)$ is a spot intensity distribution on an uppermost focused plane (z=0) in the case in which there is a pupil filter, $I_o(x, y; z=0)$ is an uppermost focused plane in an ideal optical system (that is, a diffraction-limited spot in an ideal optical system), $I_p(x, y; d_i)$ is a spot intensity distribution on a defocused plane (z=$d_i$. $d_i$ being a defocused amount), and L is a size of an interest region for focal spot calculation (an actual region being L×L). The cost function co may be calculated by a sum of powers between a focal spot in the case in which there is a pupil filter and an ideal spot. Accordingly, the cost function co corresponds to the requirement (i). The cost function ci means intra-crack spot power on a defocused plane (z=$d_i$).

The parameter pupil filter method corresponds to a method of transforming the phase of laser light passing through a pupil filter through parameterization. In an example embodiment, in the parameter pupil filter method, a function having symmetry on a plane (for example, phase symmetry on a particular plane) may be applied as a parameter. In an example embodiment, the function may be a continuous function. In an example embodiment, a domain of the continuous function may be constituted by a polynomial. In an example embodiment, the polynomial may be a Zernike polynomial (Fringe Zernike polynomial).

Figure 9:
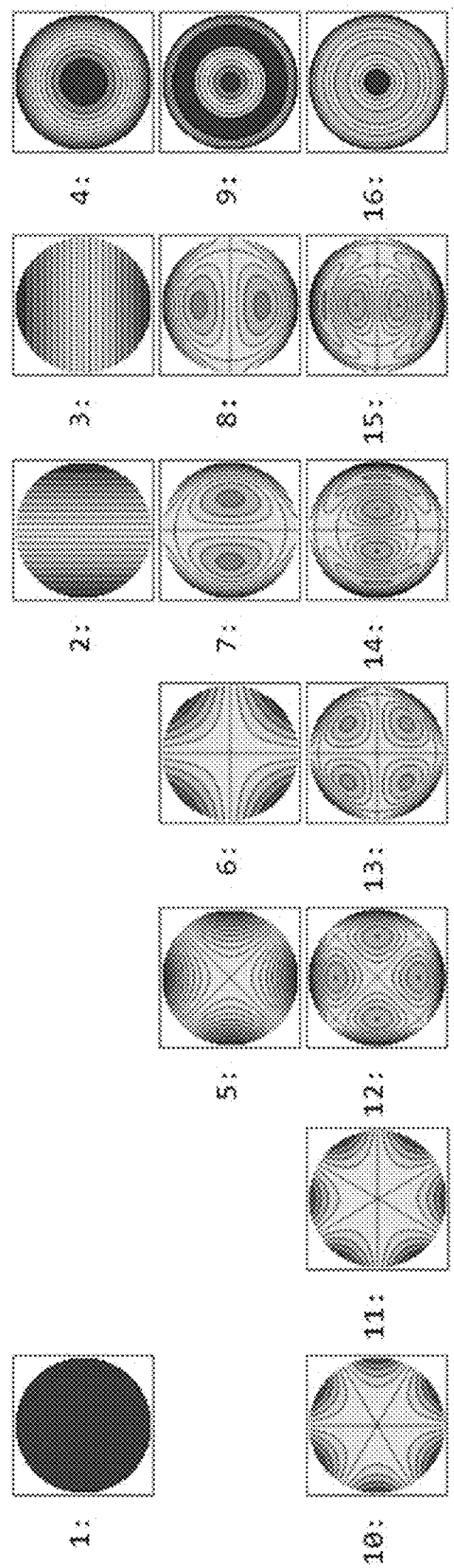
FIG. 9 shows a phase map for items of respective orders in a distribution of a Fringe Zernike polynomial.

FIG. 9 shows a phase map for items of respective orders in a distribution of a Fringe Zernike polynomial.

In an example embodiment, a defocused spot shape may be enhanced using Expression 8 which is a simply-parameterized phase expression ($W_{zer}(r, \theta)$).

$$W_{zer}(r,\theta) = \sum_{k=1}^{N_{zer}} C_k Z_k(r,\theta) \quad \text{[Expression 8]}$$

In Expression 8, $C_k$ is a Fringe Zernike coefficient, $Z_k(r, \theta)$ is a Zernike polynomial, and $N_{zer}$ is a maximum Zernike polynomial order. For validity checking, a lower-order polynomial set from $Z_2$ to $Z_{16}$ may be selected. Here, the number of coefficients according to optimization taking into consideration symmetry of a defocused spot (for example, symmetry on a plane with a scanning direction as a reference axis (for example, an x-axis)) may be limited to eight items ($C_k$; k=[2, 4, 5, 7, 9, 10, 12, 14]).

Figure 10:
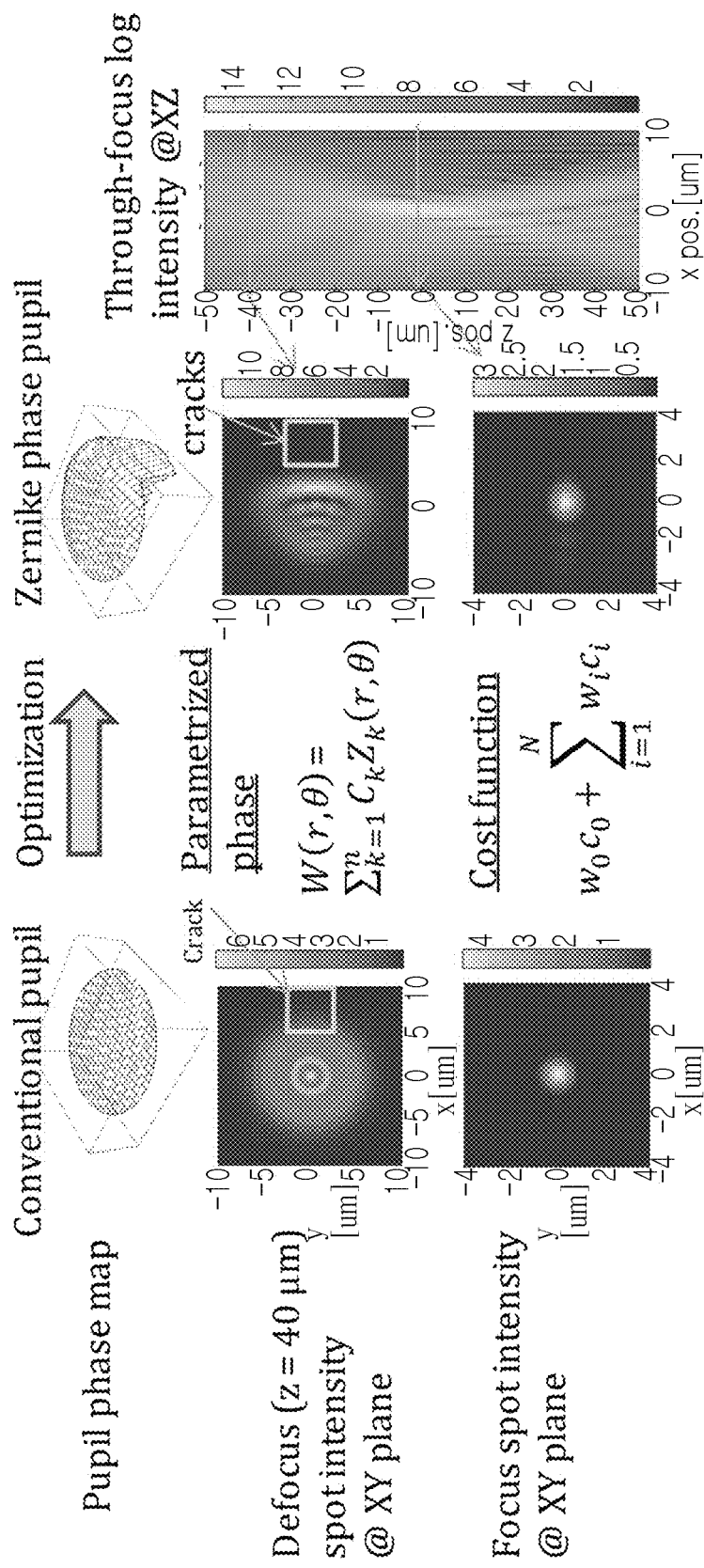
FIG. 10 is a view comparing an optimized pupil filter with a conventional pupil filter.

FIG. 10 is a view comparing an optimized pupil filter with a conventional pupil filter.

A defocused spot profile may be asymmetrically transformed using an optimized pupil filter (for example, a pupil filter based on a Zernike polynomial) in order to escape a crack. Accordingly, the optimized pupil filter may suppress splash generated due to interaction between a crack and a focused beam.

Figure 11:
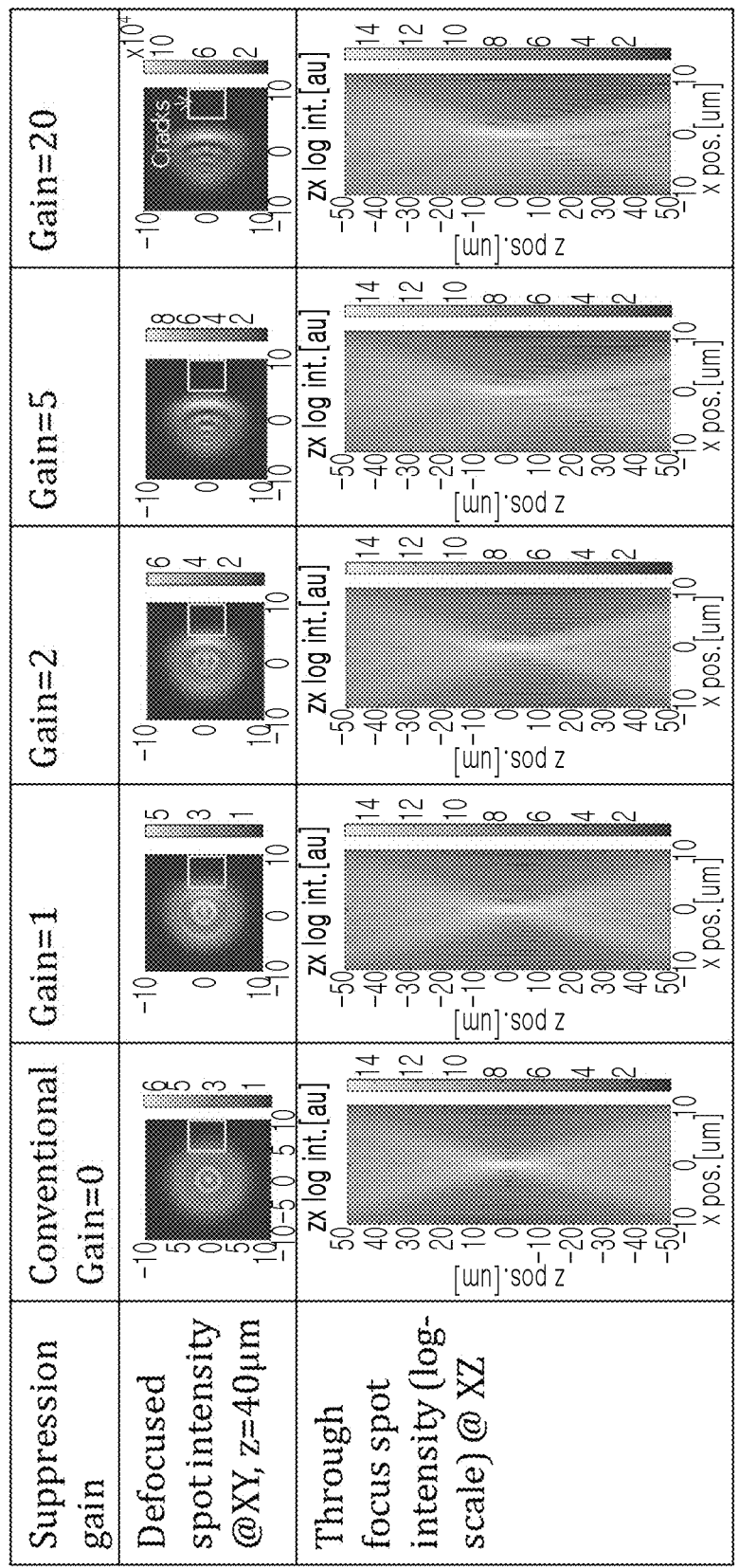
FIG. 11 shows a defocused spot profile with various splash suppression gains and a beam intensity distribution at a focused spot.
Figure 12:
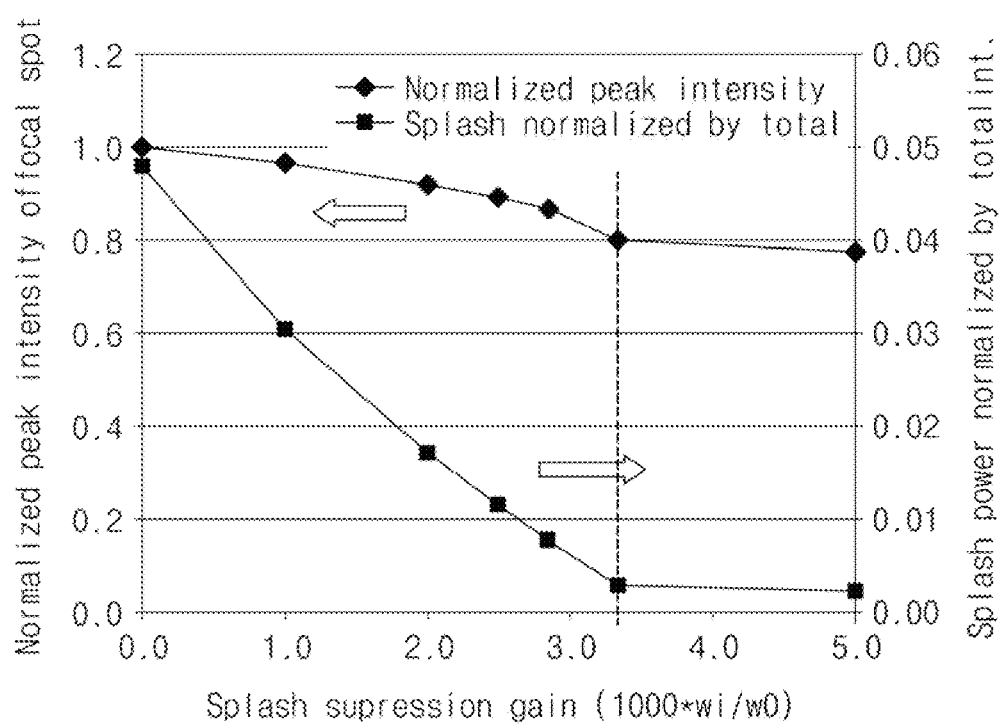
FIG. 12 is a graph depicting splash power with respect to focused spot peak intensity according to various gains.

FIG. 11 shows a defocused spot profile with various splash suppression gains and a beam intensity distribution at a focused spot. FIG. 12 is a graph depicting splash power with respect to focused spot peak intensity according to various gains.

Referring to FIG. 11, continuous defocused spot transform can be seen through splash suppression gain control. Referring to FIG. 12, spot peak intensity and splash power suppression can be seen from this graph, and a gain control function for continuous optimization (for example, application of a Zernike polynomial) was verified in this graph. In the conventional case in which a splash suppression gain is 0, splash power is measured to be 5%. When the gain increases to 3.3, splash power may be reduced to 0.3%. At the same time, peak power is reduced to 80% of the peak power in the conventional case. Splash power of 0.3% means that splash power is reduced by 90% or more, as compared to splash power of 5% in the conventional case.

Figure 13:
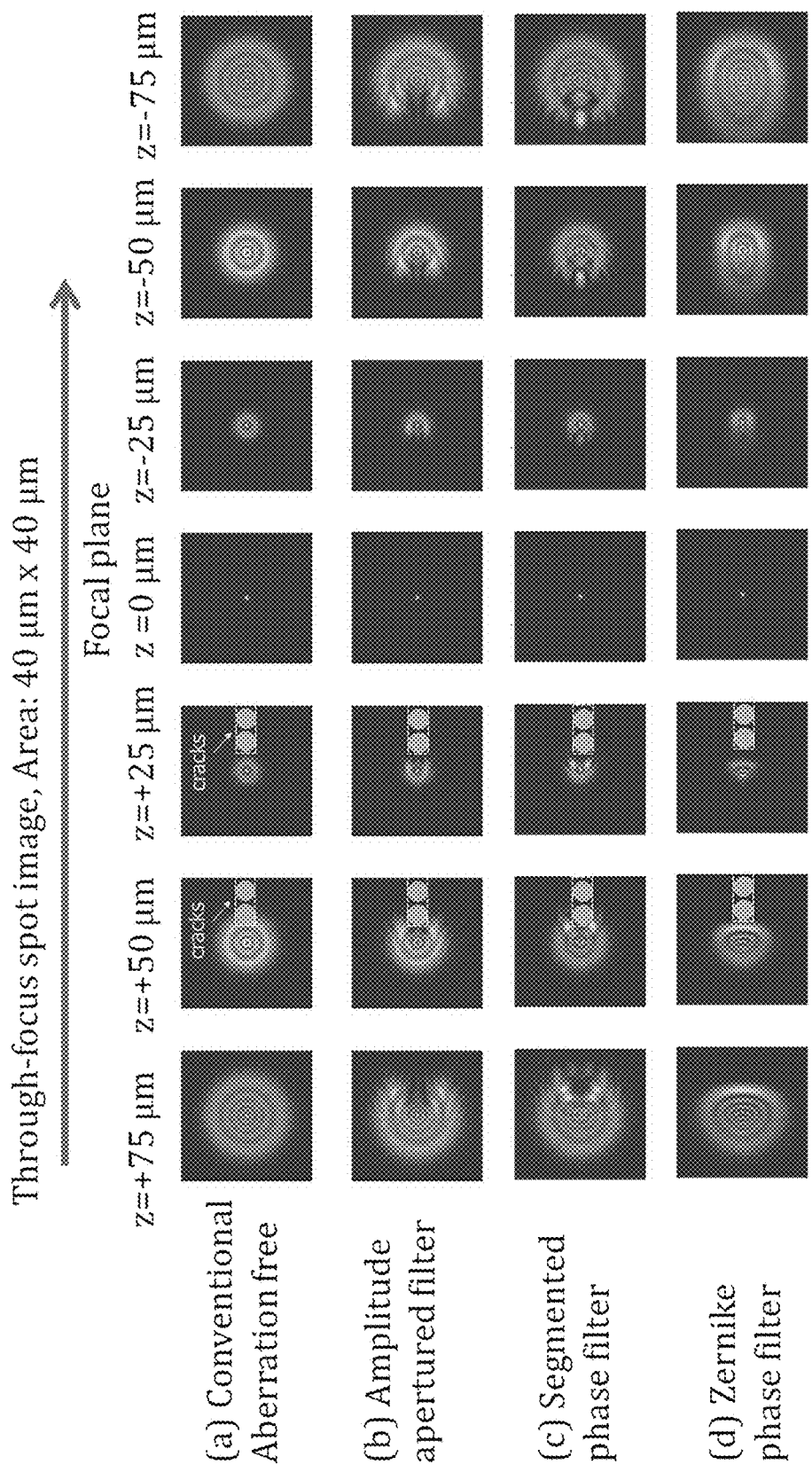
FIG. 13 shows simulation results of spot intensity passing through a focal spot using a non-processed filter, an amplitude control filter, a segmented pupil filter, and a Zernike pupil filter.

FIG. 13 shows simulation results of spot intensity passing through a focal spot using a non-processed filter, an amplitude control filter, a segmented pupil filter, and a Zernike pupil filter.

Filters of various types for splash power suppression were checked. The amplitude control filter (cf. an amplitude apertured filter (b)), the segmented pupil filter (cf. a segmented phase filter (c)), and the Zernike pupil filter (cf. a Zernike phase filter (d)) are effective for splash suppression, as compared to the non-processed filter (cf. an aberration free filter (a)). All of the three kinds of beam transform technology from (b) to (d) may deform a defocused spot in order to reduce splash power. The amplitude control filter and the segmented pupil filter reduced splash beam power in the vicinity of a crack by modulating a local portion of the defocused spot. On the other hand, the Zernike pupil filter deformed the entirety of the defocused spot in order to escape a crack-formed region using a different strategy while reducing splash power. Referring to FIG. 13, the Zernike pupil filter may be expected to efficiently reduce a diffraction beam overlapping with a crack.

Figure 14:
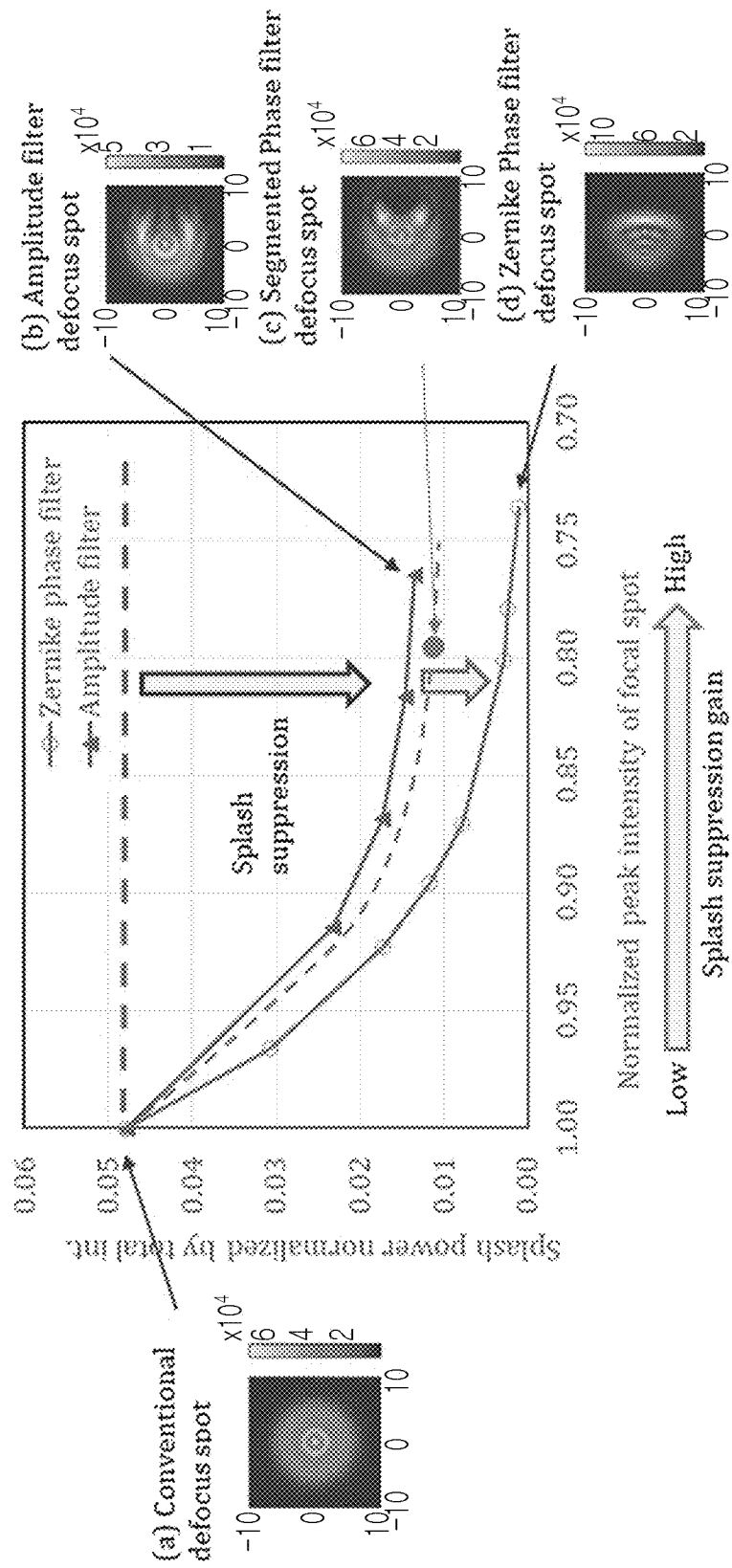
FIG. 14 shows a dispersion diagram of relation between splash power and focused peak intensity using a non-processed filter, an amplitude control filter, a segmented pupil filter, and a Zernike pupil filter.

FIG. 14 shows a dispersion diagram of relation between splash power and focused peak intensity using a non-processed filter, an amplitude control filter, a segmented pupil filter, and a Zernike pupil filter.

A data set represented in the dispersion diagram is identical to the data set represented in FIG. 4. The tradeoff between splash suppression and peak intensity reduction is clearly shown in FIG. 14. When a Zernike pupil filter is applied, splash power is reduced to 0.3%. The results show that the Zernike pupil filter can extend a limit of tradeoff caused by methods using the amplitude control filter and the segmented pupil filter.

Figure 15:
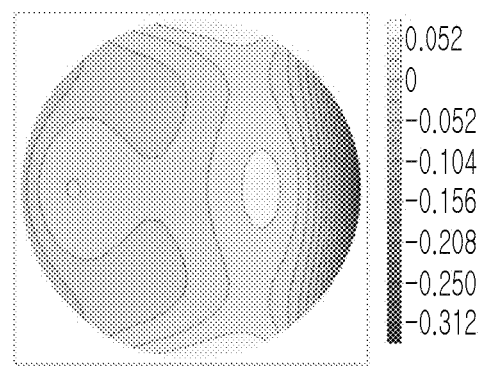
FIG. 15 shows a Zernike phase map.
Figure 16:
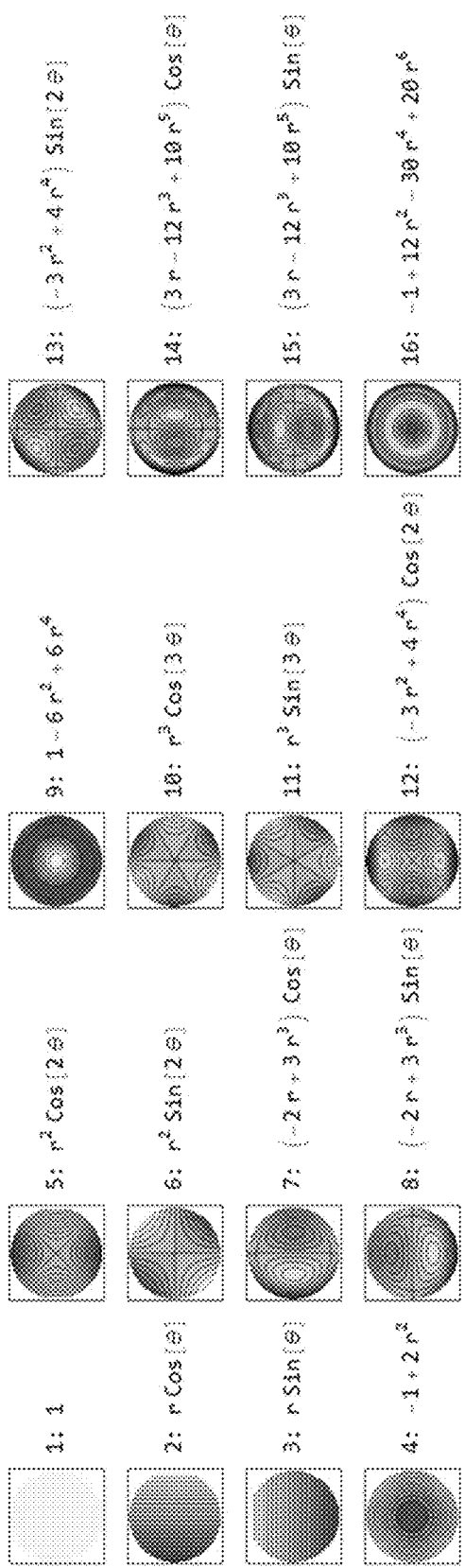
FIG. 16 shows a coefficient corresponding to each order of a Zernike polynomial and a phase map thereof.

FIG. 15 shows a Zernike phase map. FIG. 16 shows a coefficient corresponding to each order of a Zernike polynomial and a phase map thereof.

In an example embodiment, the phase of laser light passing through a pupil filter may be parameterized into a Zernike polynomial or a polynomial different therefrom. In FIG. 15, a phase W applied to a pupil filter is a phase distribution, $C_k$ is a coefficient for a k-th order of a Zernike polynomial, and $Z_k$ is a k-th Zernike polynomial.

For example, when k=1 to 16, $Z_k$ is as follows. Here, $C_1$ to $C_{16} \rightarrow Z_1$ to $Z_{16}$, C means a coefficient, $Z_k$ is a k-th Zernike polynomial, and the Zernike polynomial is $C_1 Z_1 + \ldots C_n Z_n$.

$Z_1$: 1
$Z_2$: $r^* \cos \theta$
$Z_3$: $r^* \sin \theta$
$Z_4$: $-1+2r^2$
$Z_5$: $r^2 * \cos 2\theta$
$Z_6$: $r^2 * \sin 2\theta$
$Z_7$: $(-2r+3r^3)*\cos \theta$
$Z_8$: $(-2r+3r^3)*\sin \theta$
$Z_9$: $1-6r^2+6r^4$
$Z_{10}$: $r^3 * \cos 3\theta$
$Z_{11}$: $r^3 * \sin 3\theta$
$Z_{12}$: $(-3r^2+4r^4)*\cos 2\theta$
$Z_{13}$: $(-3r^2+4r^4)*\sin 2\theta$
$Z_{14}$: $(3r^2-12r^3+10r^5)*\cos \theta$
$Z_{15}$: $(3r^2-12r^3+10r^5)*\sin \theta$
$Z_{16}$: $-1+12r^2-30r^4+20r^6$ In an example embodiment, as an order of the Zernike polynomial, a lower-order polynomial set from $Z_2$ to $Z_{16}$ may be selected. For example, as an order selected from a Zernike polynomial for optimization, at least one order of $Z_2$, $Z_4$, $Z_5$, $Z_7$, $Z_9$, $Z_{10}$, $Z_{12}$, and $Z_{14}$ and a coefficient corresponding thereto (for example, at least one of $C_2$, $C_4$, $C_5$, $C_7$, $C_9$, $C_{10}$, $C_{12}$, and $C_{14}$) may be selected, taking into consideration symmetry of a focused spot (for example, symmetry with respect to a scanning direction (for example, an x-axis)).

Figure 17:
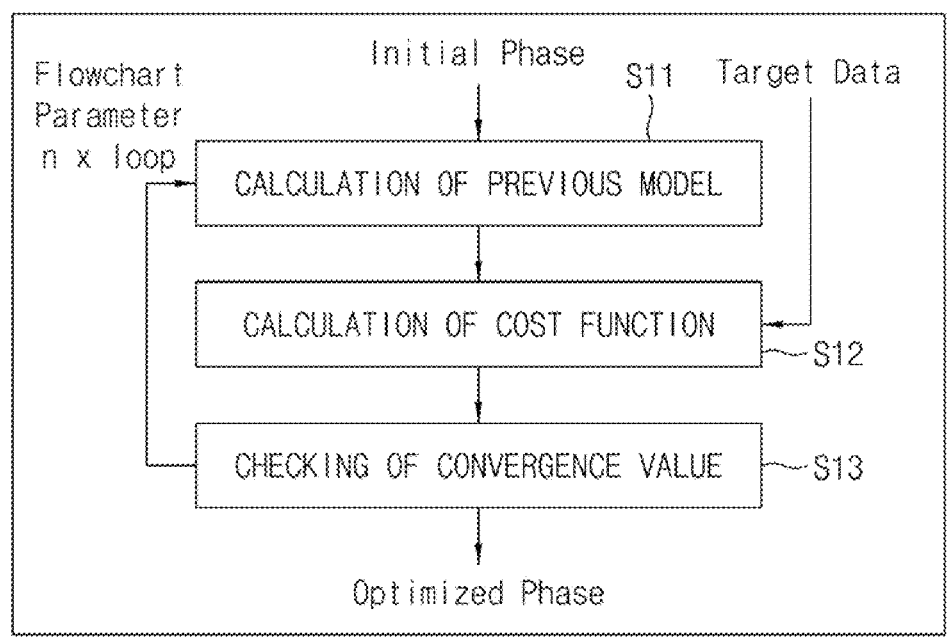
FIG. 17 is an algorithm flowchart for phase design of a pupil filter.
Figure 18:
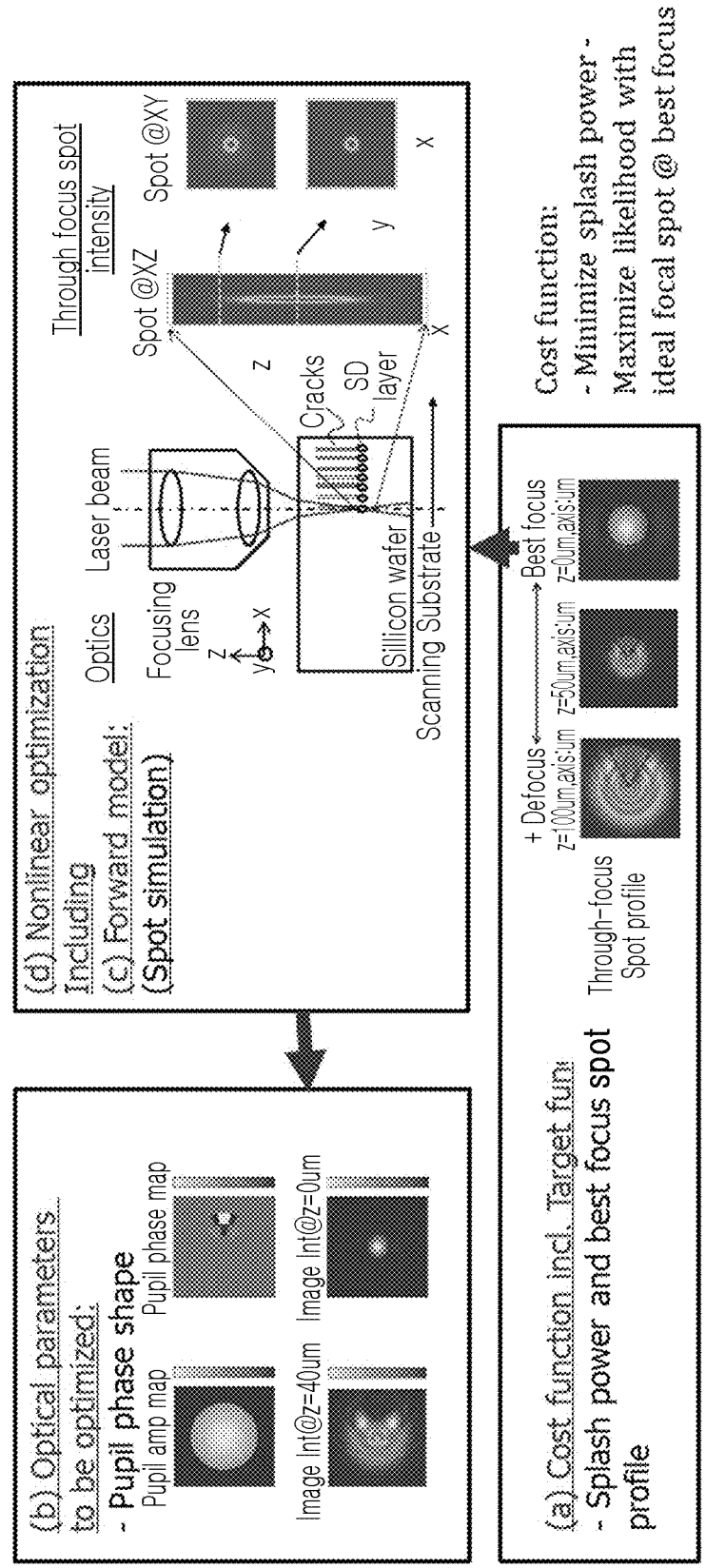
FIG. 18 is a view explaining a phase designing method of a pupil filter.

FIG. 17 is an algorithm flowchart for phase design of a pupil filter. FIG. 18 is a view explaining a phase designing method of a pupil filter.

Referring to FIGS. 3, 17, and 18, the phase designing method of the pupil filter may include calculation of a previous model, calculation of a cost function, and checking of a convergence value according to optimization. These operations may be performed in the optimizer 201 (FIG. 3).

In an example embodiment, the optimizer 201 may predetermine an optimized phase parameter by repeating, at least one time, calculation of a previous model, calculation of a cost function, and checking of a convergence value according to optimization.

For example, a calculation for an initial phase may be performed using a previous model. A cost function may be calculated based on relation between a calculated value and target data. A convergence value may be derived from the cost function, and an optimization phase parameter may be determined through the convergence value.

Referring to FIG. 18, the flowchart of FIG. 17 may be constituted by the following four parts:
 a cost function used in an optimization process—a function for a focal spot profile and splash power;
 a parameter to be optimized—a parameterized phase distribution;
 a physical simulation model on a focused spot being based on Fraunhofer diffraction; and
 an optimization algorithm embodied as a MATLAB built-in function "fminsearch" based on a Nelder_Mead simplex method.

Figure 19:
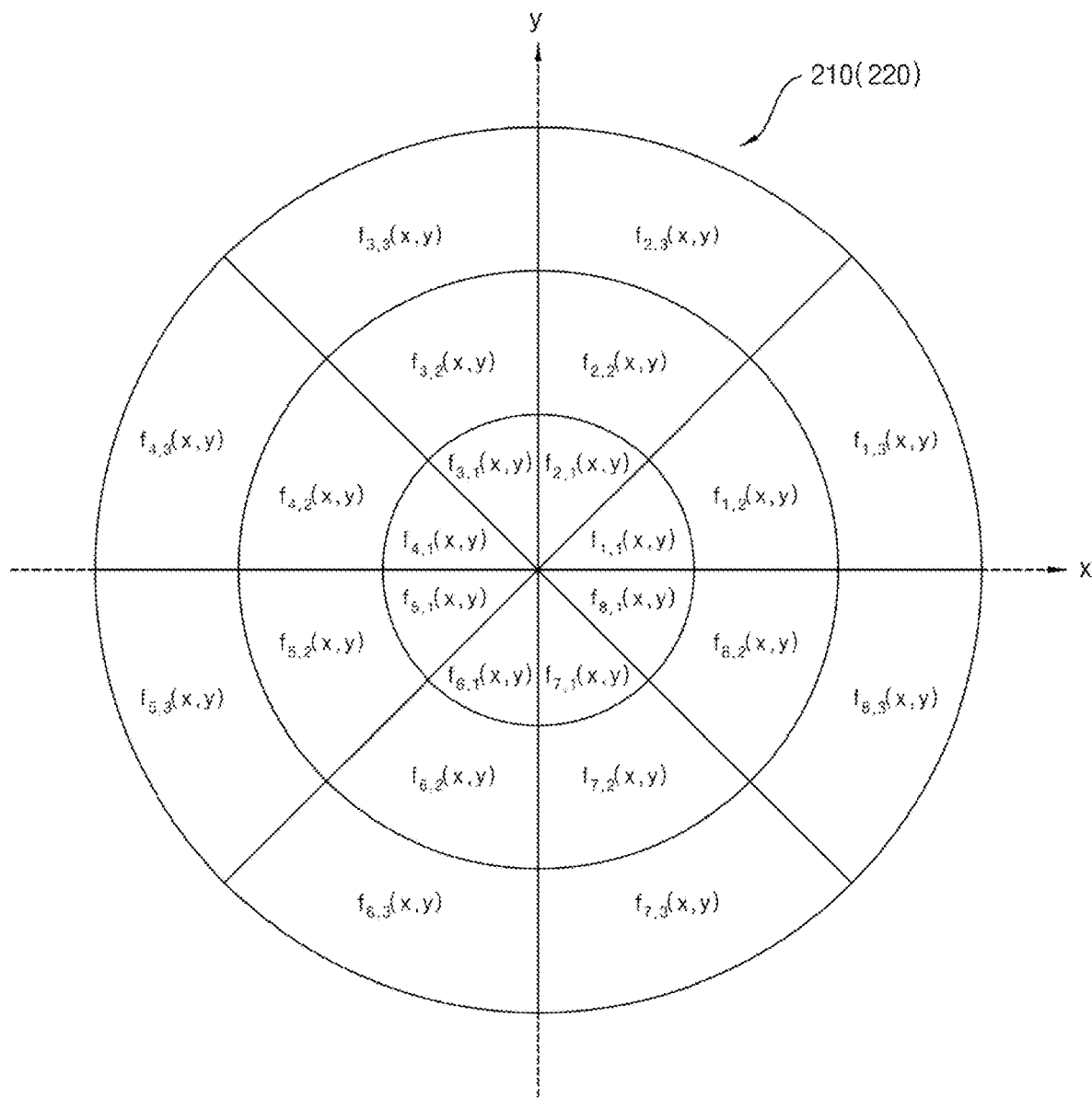
FIG. 19 shows an asymmetrical segmented pupil filter according to some example embodiments.
Figure 20:
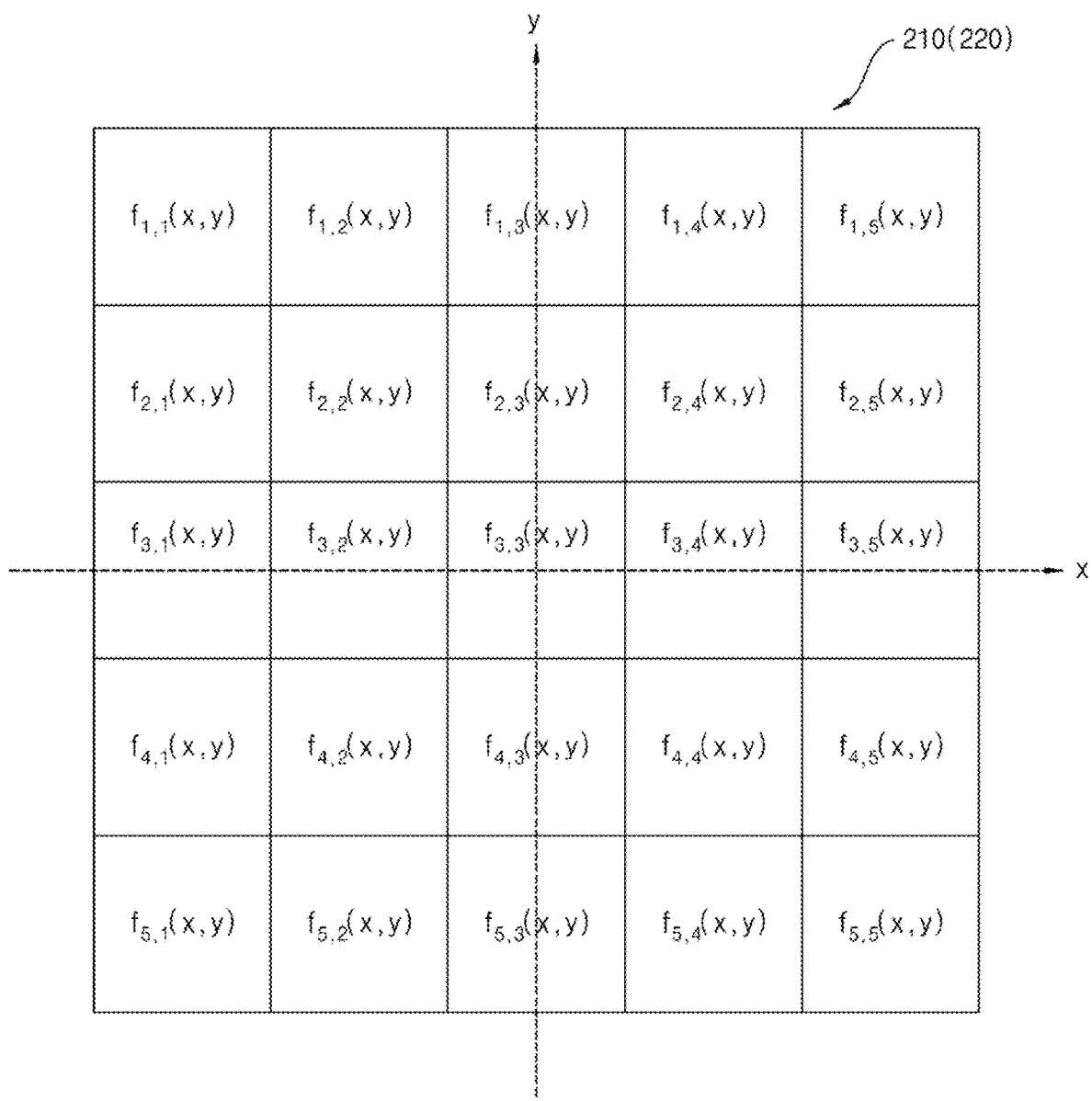
FIG. 20 shows an asymmetrical segmented pupil filter according to some example embodiments.

FIG. 19 shows an asymmetrical segmented pupil filter according to some example embodiments. FIG. 20 shows an asymmetrical segmented pupil filter according to some example embodiments.

Referring to FIGS. 3, 19, and 20, in an example embodiment, the pupil filter may be an asymmetrical segmented pupil filter. Phase control signals based on different parameters may be provided to respective segments of the asymmetrical segmented pupil filter. In an example embodiment, the first pupil filter 210 and/or the second pupil filter 220 may be an asymmetrical segmented pupil filter. For example, phase control signals $f_{p,q}(x,y)$ (p and q being natural numbers) based on different parameters may be provided to respective segments of the first pupil filter 210 and/or the second pupil filter 220.

To the phase control signals $f_{p,q}(x,y)$ provided to respective segments of the first pupil filter 210 and/or the second pupil filter 220, different functions having an in-plane symmetry (for example, phase symmetry in a particular plane) may be applied, respectively. For example, to the phase control signals $f_{p,q}(x,y)$ provided to respective segments of the first pupil filter 210 and/or the second pupil filter 220, Zernike polynomials with different orders and coefficients thereof being selected may be applied, respectively.

In an example embodiment, segments of the pupil filter may be divided into radial grids (cf. FIG. 19). For example, segments of the pupil filter may be 3 radials or more and 8 tangentials or more.

In an example embodiment, segments of the pupil filter may be divided into rectangular grids (cf. FIG. 20). For example, segments of the pupil filter may have 5*5 rectangular grids or more.

By way of summation and review, in place of cutting by a cutting blade, a method of dividing a substrate into individual chips by applying laser light may be used, in which has a concentration point inside the substrate, to enter the substrate, thereby forming a modified region and a crack inside the substrate by multiphoton absorption.

As described above, embodiments may provide a stealth dicing laser device including a pupil filter configured to transform a phase of laser light using a parameter, thereby preventing the laser light from overlapping with a modified region and a crack, which have been previously formed.

In addition, a method of transforming an amplitude of laser light condensed inside a substrate in order to prevent the laser light from spatially overlapping with a modified region and a crack, which have been previously formed, is used.

In accordance with example embodiments, it may be possible to minimize splash effects while maintaining a high peak intensity distribution of laser light.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A stealth dicing laser device, comprising:
a pulse laser generator configured to generate laser light;
a condenser lens formed in an optical path of the laser light;
a pupil filter configured to transform a phase of the laser light before the laser light passes through the condenser lens; and
a controller configured to provide a phase control signal to the pupil filter,
wherein the pupil filter transforms the phase of the laser light based on the phase control signal, and
wherein the phase control signal is a signal transforming a phase expression of the laser light based on a parameter.

2. The stealth dicing laser device as claimed in claim 1, wherein the parameter is constituted by a continuous function.

3. The stealth dicing laser device as claimed in claim 2, wherein a domain of the continuous function is constituted by a polynomial.

4. The stealth dicing laser device as claimed in claim 3, wherein a phase map for each coefficient of the polynomial has a phase distribution having symmetry with reference to an axis in a scanning direction.

5. The stealth dicing laser device as claimed in claim 1, wherein a phase expression ($W_{zer}(r,\theta)$) of the laser light transformed based on the parameter conforms to the following Expression 1:

$$W_{zer}(r, \theta) = \sum_{k=1}^{N_{zer}} C_k Z_k(r, \theta) \quad \text{[Expression 1]}$$

wherein, in Expression 1, $C_k$ is a Fringe Zernike coefficient, $Z_k(r, \theta)$ is a Zernike polynomial, and $N_{zer}$ is a maximum Zernike polynomial order.

6. The stealth dicing laser device as claimed in claim 5, wherein an order of the maximum Zernike polynomial is a fourteenth order.

7. The stealth dicing laser device as claimed in claim 5, wherein an order of the Zernike polynomial is selected from at least one of second, fourth, fifth, seventh, ninth, tenth, twelfth, and fourteenth orders.

8. The stealth dicing laser device as claimed in claim 1, wherein:
laser light emerging from the condenser lens passes through a silicon semiconductor substrate; and
the laser light emerging from the condenser lens has an on-plane asymmetrical shape with reference to an axis perpendicularly intersecting a scanning direction in a defocused region inside the silicon semiconductor substrate.

9. The stealth dicing laser device as claimed in claim 8, wherein the laser light has a symmetrical shape with reference to an axis parallel to the scanning direction in the defocused region of the silicon semiconductor substrate.

10. The stealth dicing laser device as claimed in claim 1, wherein the pupil filter is an asymmetrical segmented pupil filter divided into a plurality of segments to which phase control signals based on different parameters are provided, respectively.

11. The stealth dicing laser device as claimed in claim 10, wherein the segments of the pupil filter have 3 radials or more and 8 tangentials or more.

12. The stealth dicing laser device as claimed in claim 10, wherein the segments of the pupil filter have 5*5 rectangular grids or more.

13. The stealth dicing laser device as claimed in claim 1, wherein:
the pupil filter is provided in plural; and
the controller is configured to provide the phase control signal to at least one of the plurality of pupil filters.

14. A stealth dicing laser device, comprising:
a pulse laser generator configured to generate laser light;
an expander configured to allow the laser light to pass therethrough, the expander including at least one lens;
at least one mirror configured to reflect the laser light;
a prism mirror configured to reflect the laser light or to allow the laser light to pass therethrough;
relay optics configured to allow the laser light to pass therethrough, the relay optics including at least one lens;
a condenser lens formed in an optical path of the laser light;
a plurality of pupil filters configured to transform a phase of the laser light before the laser light passes through the condenser lens;
a controller configured to provide a phase control signal to at least one of the plurality of pupil filters; and
an optimizer configured to optimize the phase control signal through a parameter,
wherein the at least one of the plurality of pupil filters provided with the phase control signal transforms the phase of the laser light based on the phase control signal, and
wherein the phase control signal is a signal transforming a phase expression of the laser light based on the parameter.

15. The stealth dicing laser device as claimed in claim 14, wherein the plurality of pupil filters includes:
a first pupil filter configured to reflect the laser light reflected from or passing through the prism mirror such that the laser light is again reflected from or again passes through the prism mirror; and
a second pupil filter disposed on an optical path between the relay optics and the condenser lens.

16. The stealth dicing laser device as claimed in claim 15, wherein the controller provides the phase control signal to at least one of the first pupil filter and the second pupil filter.

17. The stealth dicing laser device as claimed in claim 14, wherein:
the parameter is a continuous function, and a domain of the continuous function is constituted by a polynomial; and
the polynomial is a Zernike polynomial.

18. The stealth dicing laser device as claimed in claim 17, wherein a phase map for each coefficient of the Zernike polynomial has a symmetrical shape with reference to an axis parallel to a scanning direction.

19. The stealth dicing laser device as claimed in claim 18, wherein an order of the Zernike polynomial is selected from at least one of second, fourth, fifth, seventh, ninth, tenth, twelfth and fourteenth orders.

20. A stealth dicing laser device for formation of a stealth dicing layer at a silicon layer, the stealth dicing laser device comprising:
a pulse laser generator configured to generate laser light;

a condenser lens formed in an optical path of the laser light;
a pupil filter configured to transform a phase of the laser light; and
a controller configured to provide a phase control signal to the pupil filter,
wherein the pupil filter transforms the phase of the laser light based on the phase control signal,
wherein the phase control signal is a signal transforming a phase expression of the laser light based on a parameter,
wherein the parameter is a continuous function, and a domain of the continuous function is constituted by a polynomial,
wherein the polynomial is a Zernike polynomial, and
wherein an order of the Zernike polynomial is selected from at least one of second, fourth, fifth, seventh, ninth, tenth, twelfth and fourteenth orders.

\* \* \* \* \*